(12) United States Patent
Maier

(10) Patent No.: US 11,635,891 B2
(45) Date of Patent: Apr. 25, 2023

(54) GRID PLATE

(71) Applicant: Ferdinand Maier, Neumarkt am Wallersee (AT)

(72) Inventor: Ferdinand Maier, Neumarkt am Wallersee (AT)

(73) Assignees: FM MARKETING GMBH, Neumarkt am Wallersee (AT); Ferdinand Maier, Neumarkt am Wallersee (AT)

( * ) Notice: Subject to any disclaimer, the term of this patent is extended or adjusted under 35 U.S.C. 154(b) by 0 days.

(21) Appl. No.: 16/495,795

(22) PCT Filed: Mar. 20, 2018

(86) PCT No.: PCT/EP2018/057072
§ 371 (c)(1),
(2) Date: Sep. 19, 2019

(87) PCT Pub. No.: WO2018/172377
PCT Pub. Date: Sep. 27, 2018

(65) Prior Publication Data
US 2020/0026424 A1    Jan. 23, 2020

(30) Foreign Application Priority Data

Mar. 22, 2017    (DE) .......................... 102017106207.6

(51) Int. Cl.
*G06F 3/0488*    (2022.01)
*G06F 3/01*    (2006.01)
(Continued)

(52) U.S. Cl.
CPC .......... *G06F 3/04886* (2013.01); *G06F 3/016* (2013.01); *G06F 3/044* (2013.01);
(Continued)

(58) Field of Classification Search
CPC .... G06F 3/04886; G06F 3/016; G06F 3/0416; G06F 3/044; H03K 17/96; H03K 2217/96062
See application file for complete search history.

(56) References Cited

U.S. PATENT DOCUMENTS 6,310,606 B1 * 10/2001 Armstrong .............. G06F 3/016
345/157
8,358,226 B2 * 1/2013 Reynolds ........... G01R 27/2605
178/18.06
(Continued)

FOREIGN PATENT DOCUMENTS

DE    102007020930 A1    11/2008
DE    102009052928 A1 *  5/2011    ............. B60K 35/00
(Continued)

*Primary Examiner* — Joseph R Haley
*Assistant Examiner* — Jennifer L Zubajlo
(74) *Attorney, Agent, or Firm* — Dragon Sun Law Firm, PC; Jinggao Li, Esq.; Nathaniel Perkins

(57) ABSTRACT

The invention relates to an input device (6) for operating a multimedia device (4) depending on the position of a user's finger on a pressure plate (24) comprising:
the pressure plate (24) which comprises a bottom side (50) and a top side (48) opposite the bottom side (50), on which the user can move their finger,
a regular grid (15) made of tactile elements (26) which can be haptically sensed by the finger of the user and which are formed on the top side (48) of the pressure plate (24), and
a sensor (62) arranged on the bottom side (50) of the pressure plate (24) which is set up to transmit a button selection signal (42) to the multimedia device (4) depending on the position of the finger on the top side (48).

20 Claims, 9 Drawing Sheets

(51) Int. Cl.
*G06F 3/041* (2006.01)
*H03K 17/96* (2006.01)
*G06F 3/044* (2006.01)
*G06F 3/04886* (2022.01)

(52) U.S. Cl.
CPC ........... *G06F 3/0416* (2013.01); *H03K 17/96* (2013.01); *H03K 2217/96062* (2013.01)

(56) References Cited

U.S. PATENT DOCUMENTS

| | | | | |
|---|---|---|---|---|
| 9,041,647 | B2 * | 5/2015 | Grant | G06F 3/016 |
| | | | | 345/173 |
| 9,829,977 | B2 * | 11/2017 | Heubel | G06F 3/016 |
| 10,133,413 | B2 * | 11/2018 | Nakajima | G06F 1/3262 |
| 10,566,151 | B1 | 2/2020 | Wang | H03K 17/9625 |
| 10,620,705 | B2 * | 4/2020 | Marchant | G06F 3/0202 |
| 2005/0024342 | A1 * | 2/2005 | Young | B60K 35/00 |
| | | | | 345/173 |
| 2008/0297475 | A1 * | 12/2008 | Woolf | G06F 3/0234 |
| | | | | 345/173 |
| 2013/0100030 | A1 * | 4/2013 | Los | G06F 3/0443 |
| | | | | 345/169 |
| 2013/0161164 | A1 * | 6/2013 | Taka | G06F 3/016 |
| | | | | 200/181 |
| 2013/0215035 | A1 * | 8/2013 | Guard | G06F 3/0445 |
| | | | | 345/173 |
| 2014/0172186 | A1 * | 6/2014 | Mashkevich | H01H 13/84 |
| | | | | 701/1 |
| 2015/0007232 | A1 * | 1/2015 | Martch | H04N 21/41265 |
| | | | | 725/44 |
| 2015/0062074 | A1 * | 3/2015 | Wang | G06F 3/0443 |
| | | | | 345/174 |
| 2015/0344059 | A1 * | 12/2015 | Kim | B60K 37/06 |
| | | | | 345/184 |
| 2016/0026267 | A1 * | 1/2016 | Imai | B60K 35/00 |
| | | | | 345/174 |
| 2016/0085371 | A1 * | 3/2016 | Wang | H03K 17/9622 |
| | | | | 345/174 |
| 2017/0285781 | A1 * | 10/2017 | Degner | G06F 3/042 |
| 2018/0121012 | A1 * | 5/2018 | Asrani | G06F 1/1626 |
| 2019/0200069 | A1 * | 6/2019 | Maier | G06F 3/04845 |
| 2020/0064949 | A1 * | 2/2020 | Maier | H03K 17/9622 |

FOREIGN PATENT DOCUMENTS

| | | |
|---|---|---|
| DE | 102009052928 A1 | 5/2011 |
| DE | 102012019979 A1 | 4/2014 |
| EP | 0893297 A2 | 1/1999 |

* cited by examiner

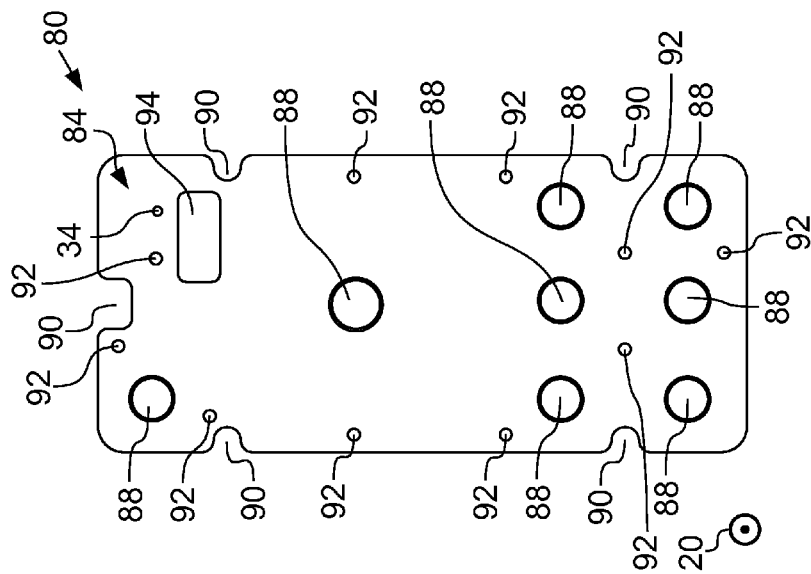
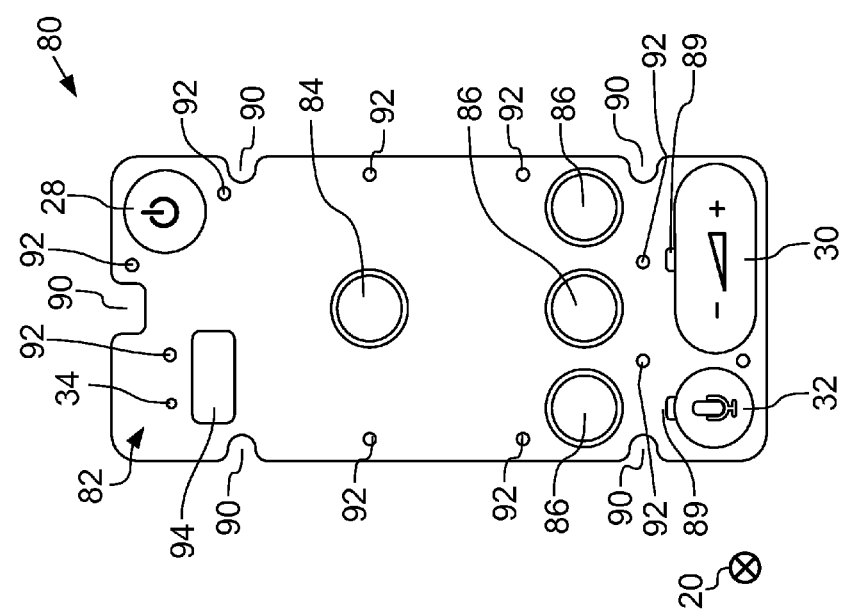

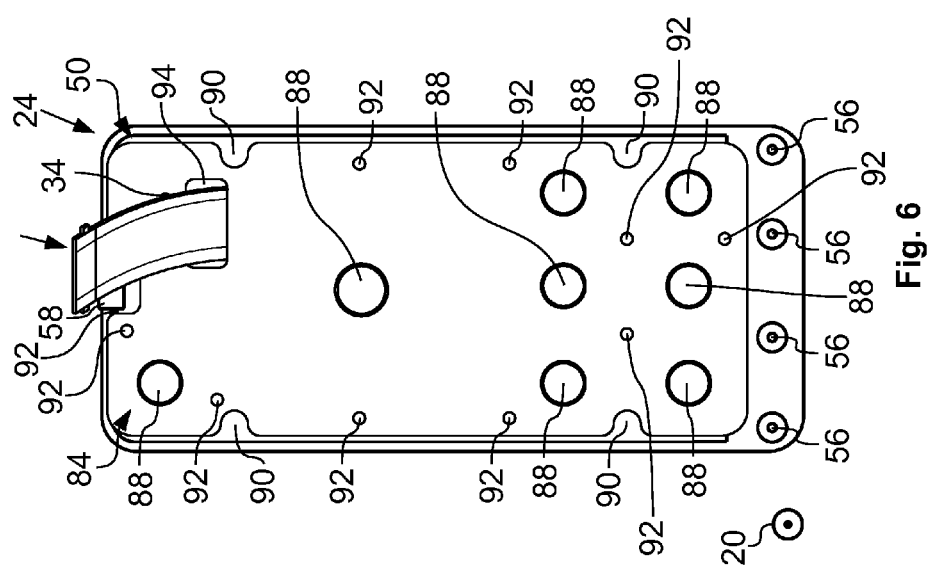

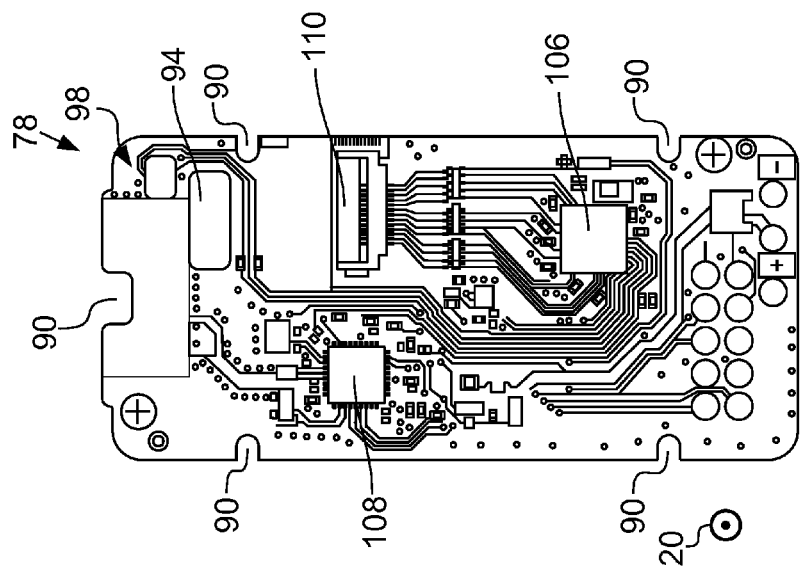
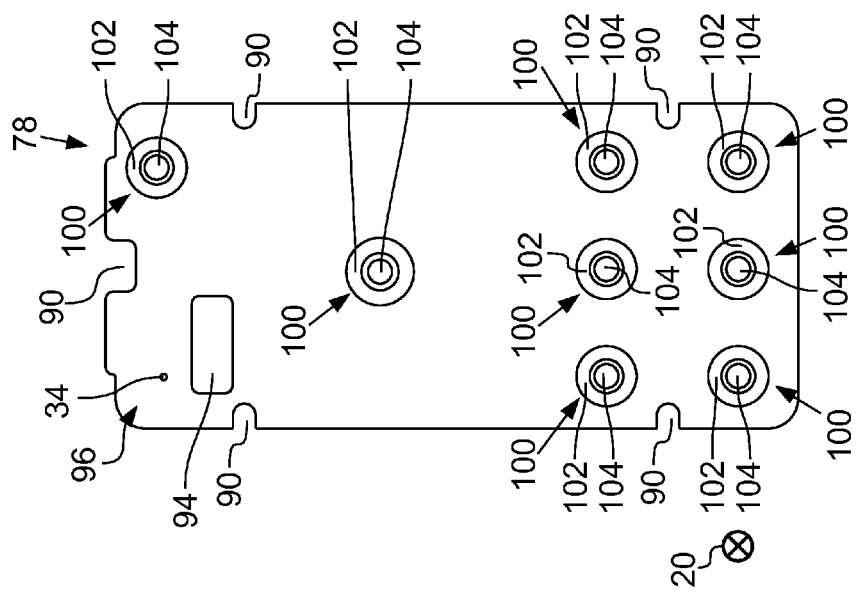

GRID PLATE

TECHNICAL FIELD

The present invention relates to an input device for operating a multimedia device depending on the position of a user's finger on a pressure plate, a method for recording control information with the input device, and a control device for carrying out the method.

BACKGROUND

An input device to operate a multimedia device depending on the position of a user's finger on various buttons is known from US 2014/0172186 A1.

It is the object of the invention to improve the input device.

SUMMARY

The task is fulfilled by the characteristics of the independent claims. Advantageous embodiments of the invention are the subject matter of the dependent claims.

In compliance with one aspect of the invention, an input device for operating a multimedia device depending on the position of a user's finger on a pressure plate comprises the pressure plate which comprises a bottom side and a top side opposite the bottom side, on which the user can move their finger, a regular grid made of tactile elements which can be haptically sensed by the user's finger and which are formed on the top side of the pressure plate, and a sensor arranged on the bottom side of the pressure plate, and is designed to transmit a button selection signal to the multimedia device depending on the position of the finger on the top side.

Compared to the above-mentioned input device on which individual buttons for operating the multimedia device are arranged, and wherein each button is assigned its own capacitive sensor on the input device to determine the position of the user's finger, the cited input device has only one individual input element in the form of the pressure plate and a position sensor assigned to the pressure plate, analogous to a touchpad. The cited input device is therefore designed in a significantly simpler way compared to the input device mentioned at the outset. Unlike a touchpad, however, the user can feel operating elements on the pressure plate which are assigned to certain functions on the multimedia device and, therefore, basically does not require any distracting and time-consuming interaction with a screen to select the functions. The multimedia device is operated purely intuitively via the cited input device, so that a visual interaction with the user's fingers is basically not required.

ASPECTS

In an embodiment of the cited input device, the tactile elements which can be detected in a haptic manner are depressions molded into the top side of the pressure plate. It is easier for the user to feel such depressions compared to elevations, because the concave depressions offer a more even pressure distribution for the convex fingers of the user. In contrast, the user would feel convex elevations only at a single pressure point on their finger.

In a particular embodiment of the cited input device, the depressions have a maximum width between 5 mm and 15 mm in the direction of the surface of the pressure plate. With these linear extensions, the depressions are optimally adapted to the average size of fingers of human users.

In a preferred embodiment of the cited input device, the depressions essentially have the shape of a ball segment. The ball-segment shape enables a particularly large contact area between the user's finger and the depression, so that it is easy for the user to feel the depression.

In a particularly preferred embodiment of the cited input device, the depressions, preferably having a ball-segment shape, have a depth between 5% and 15% of the maximum width. In this area for the depth, the contact surface between the depressions and the user's finger is at a maximum, so that the user can optimally perceive each individual depression haptically without the pressure plate itself having to be thick enough to provide sufficient thickness for the depth.

In another embodiment of the cited input device, the grid is designed as a structured grid. The grid is thus designed to look like a menu, which makes the specified input device an excellent replacement for a touchscreen for operating a smartphone, for example, in a vehicle.

In a particularly preferred embodiment of the cited input device, the structured grid is a Cartesian grid. In this way, the input device is thus designed to look like a tile menu such as that commonly used on smartphones.

To execute the pressure plate with the grid as small as possible so that it can be installed in areas with small assembly space such as a steering wheel, the depressions should abut each other.

In another embodiment of the cited input device, the pressure plate is mounted so that it can move in a direction vertical to the top side and bottom side, wherein a pressure button is arranged on the bottom side of the pressure plate to generate a button activation signal when it is pressed. In this way, the generation of the button selection signal for generating a display where the user's finger is located can be separated from the generation of another button selection signal for triggering a particular function associated with that finger position, thereby avoiding malfunctions. This can be particularly relevant to safety in vehicles. In principle, however, the function can also be triggered by other technical strategies, for example if the user keeps their finger in the selected position for a certain period of time.

In accordance with a further aspect of the invention, a method to record control information by means of one of the cited input devices comprises the steps: recording the position of the user's finger on the pressure plate, transmitting the button selection signal depending on the recorded position, and transmitting a button selection signal if a specified requirement is fulfilled, wherein the button selection signal in combination with the button confirmation signal is the control information.

According to a further aspect of the invention, a control device is set up to implement one of the stated methods.

In a further refinement of the cited device, the cited device has a memory and a processor. The cited method is saved in the memory in the form of a computer program, and the processor is provided for executing the method when the computer program is loaded from the memory into the processor.

According to a further aspect of the invention, a computer program comprises program coders for executing all the steps of the cited method when the computer program is executed on a computer or one of the cited devices.

According to another aspect of the invention, a computer program product contains a program code which is saved on a computer-readable data carrier, and which carries out the cited method when it is executed on a data processing device.

In accordance with a further aspect of the invention, a playback device comprises a screen for displaying a menu from a number of menu elements arranged in a grid and one of the previously mentioned control devices.

In accordance with a further aspect of the invention, a remote control comprises a pushbutton with a number of haptically perceptible segments arranged in a grid, a position sensor for detecting a position of a user's finger on the grid, and a transmission interface for sending a position signal depending on the position of a user's finger on the pushbutton, as well as a trigger signal when the pushbutton is pressed by the user.

In accordance with a further aspect of the invention, a multimedia system comprises one of the said reproduction devices and the previously cited remote control.

BRIEF DESCRIPTION OF THE DRAWINGS

The above-described properties, features and advantages of this invention, as well as the manner in which they are achieved, will become clearer in connection with the following description of the embodiments, which are described in more detail in connection with the drawings, in which:

FIG. 2b is a bottom side of the pressure plate of FIG. 2a,

FIG. 3b is a bottom side of the capacitive sensor of FIG. 3a,

FIG. 5a is a top side of a switching plate in the remote control of FIG. 1, FIG. 5b is a bottom side of the switching plate of FIG. 5a, FIG. 6 is a view of the pressure plate and the capacitive sensor connected to it and the switching plate of the bottom side, FIG. 7a is a top side of a printed circuit board in the remote control of FIG. 1, FIG. 7b is a bottom side of the printed circuit board of FIG. 7a, FIG. 8 is a view of the pressure plate and the capacitive sensor connected to it, the switching plate and the pressure plate of the bottom side.

Figure 1:
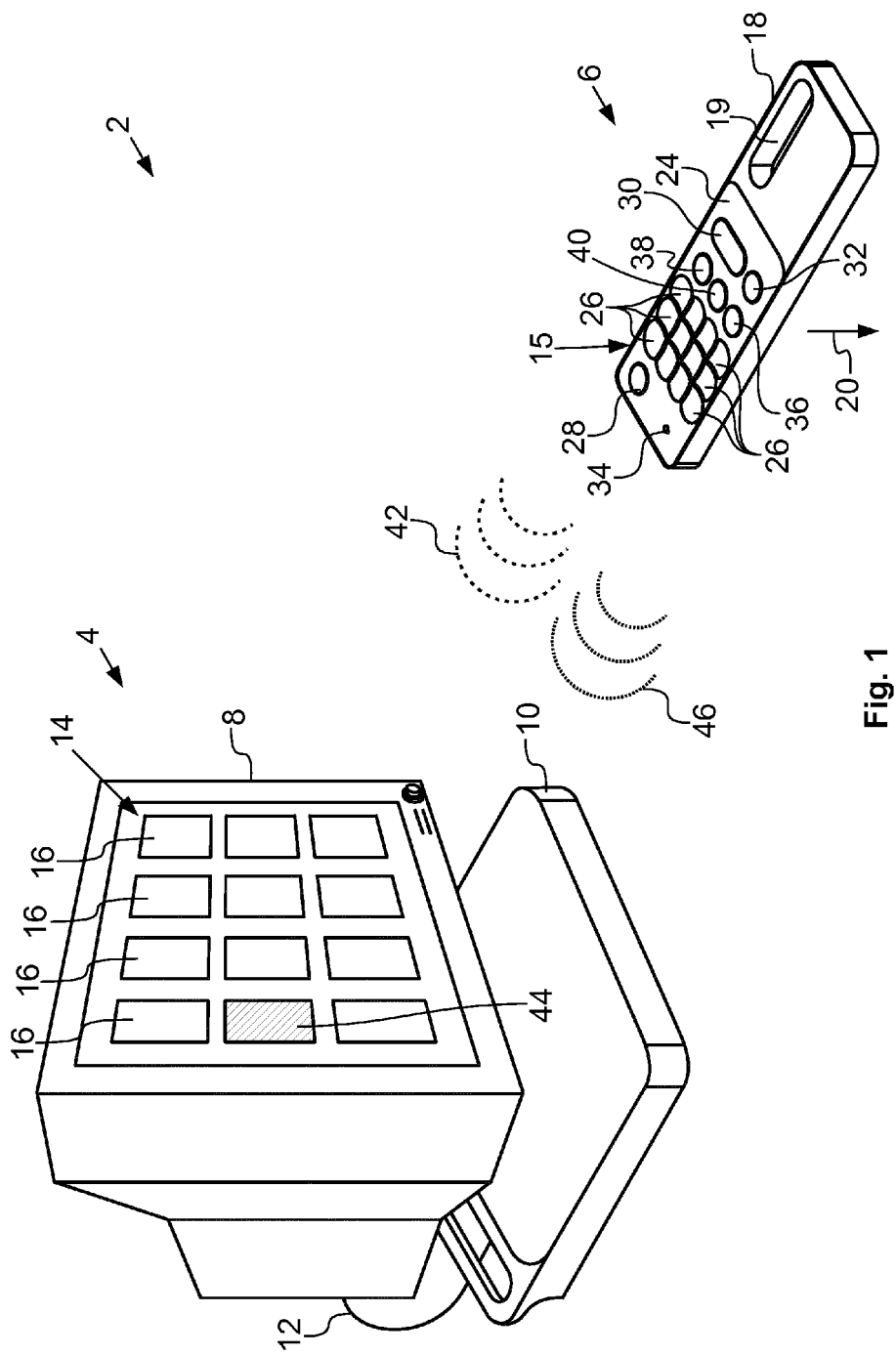
FIG. 1 is a schematic representation of a multimedia system with a reproduction device and a remote control.

In the drawings, the same technical elements are provided with the same reference signs, and are only described once. The drawings are purely schematic and, in particular, do not reflect the actual geometric proportions.

DETAILED DESCRIPTION

Reference is made to FIG. 1 which is a schematic representation of a multimedia system 2 with a playback device 4 and an input interface in the form of a remote control 6. The multimedia system 2 is designed to play back media content, still to be described in more detail, on a screen 8 of the playback device 4. The image signals required for presenting the media content on the screen 8 are generated in a control device in the form of a set top box 10 in a manner known per se, and transmitted to the screen 8 via a data cable 12 in a manner known per se. For the sake of brevity, this shall not be described in any further detail.

One example for a media content displayed on the screen 8 is a menu 14 indicated on the screen 8 in FIG. 1. The menu 14 comprises twelve menu elements 16 which are arranged in a Cartesian grid 15 referenced in FIG. 2. For the sake of clarity, not all of these menu elements 16 are given their own reference signs in FIG. 1.

The menu 14 is used to control the function of the set top box 10 and the playback of other media content via the remote control 6. Before this control is explained further, the design of the remote control 6 shall first be explained in detail.

The remote control 6 comprises a metal housing 18 with an opening 19, among other things, to reduce the weight. A plastic pressure plate 24 which is held in the housing 18 can be moved in a direction of pressure 20. A number of twelve tactile elements or segments which can be detected in a haptic manner in the form of depressions 26 are arranged on this pressure plate 24 in the same grid 15 as the grid 15 of the menu 14 on the screen 8. Each of the depressions 26 on the remote control 6 is assigned a menu item 16 of the menu.

The remote control 6 also comprises buttons which project through the pressure plate 24, and which can be pushed independently of it. It includes an On/Off button 28 for activating the entire multimedia system 4 or only a part of it, or putting it into standby, a volume rocker key 30 for controlling a volume of the media playback, and a speech recognition activation button 32 for activating a control of the multimedia system 2 by means of speech via a microphone 34.

The buttons, which can be pushed independently from the pressure plate 24, also include a scrolling button 36, a second scrolling button 38, and a return button 40 which shall be described in more detail later in the description of controlling the function of the set top box 10 by means of the remote control 6. To distinguish the pressure plate 24 from the remaining buttons 30 to 40, they can be executed optionally in high gloss compared to the pressure plate 24.

A user using the remote control 6 for controlling the function of the set top box 10 can place their finger in any of the depressions 26. Underneath the pressure plate 24, an electronics assembly is arranged in the housing 18 of the remote control 6 having a position sensor, which will be described in more detail later, in the form of a switch membrane for detecting in which depression 26 the user's finger has been put, and which transmits a corresponding position signal 42 to the set top box 10 with a transmission interface not shown here. This electronics assembly will be described in more detail later.

The set top box 10 then recognizes the depression 26 in which the user's finger is put by means of the position signal 42, and marks the menu element 16 assigned to this depression 26 with a highlighting 44 indicated with hatching in FIG. 1.

If the user moves their finger and puts it in another depression 26, the remote control 6 transmits the movement of the finger with the position signal 42 via the transmission interface, so that the set top box 10 can move the highlighting 44 accordingly. In this way, the user can always see which depression 26 they have their finger in.

If the user's finger is in a depression 26 which is assigned to a menu item 16 which is the user wants to select for controlling the set top box 10, he pushes the pushbutton 24 down around the axis 20. The electronics assembly of the remote control 6, which still has to be described in more detail, detects this pressure and transmits a corresponding trigger signal 46 to the set top box 10, also via the transmission interface for activating the function assigned to the currently highlighted menu item 16.

Figure 2B:
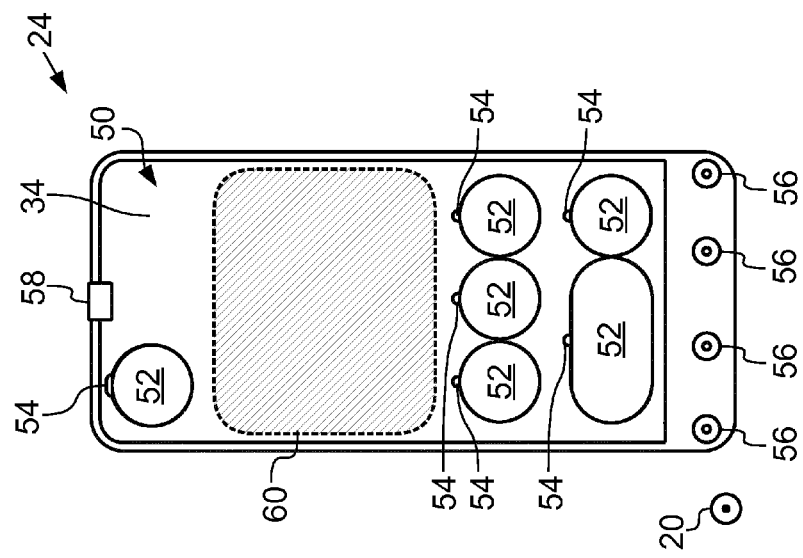
Figure 2A:
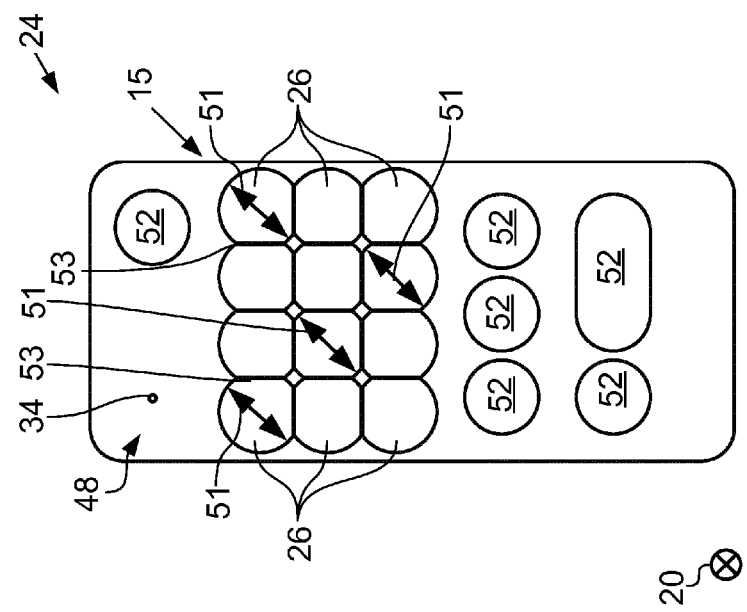
FIG. 2a is a top side of a pressure plate in the remote control of FIG. 1.

Before the electronics of the remote control 6 is discussed in more detail, first the pressure plate 24 shall be described in more detail using FIG. 2a which shows the top side 48 of the pressure plate 24 and FIG. 2b which shows the bottom side 50 of the pressure plate 24.

The depressions 26 are essentially embedded in the top side 48 of the pressure plate 48 in the shape of ball segments, so that the user can put their finger in them with a large contact area between finger and depression 26. In this way, it is particularly easy for the user to detect the depressions 26. The individual depressions 26 have a maximum width of the base circle radius 51 if you consider each depression 26 as ball segment and the base circle as flush with the surface of the top side 48 of the pressure plate 24. For the sake of clarity, not all of the individual base circle radii 51 are marked with reference signs in FIG. 2a. Base circle radii 51 between 5 mm and 15 mm haven proven to be particularly suitable for tactility. As ball segment height for the extension of depth of the depressions 26 which cannot be seen in the perspective of FIG. 2a, between 5% and 15% of the respective base circle radius have proven to be particularly suitable for good tactility. In principle, not all of the depressions 26 need to have the same geometric dimensions.

In addition, the individual depressions 26 are positioned in such a way that the ball segments overlap, and cut-off edges 53 are executed between the depressions 26. These cut-off edges 53 can also be sensed by tactile means very clearly by the user, so that the individual depressions 26 can be detected clearly in a haptic manner when moving the finger. Not all the cut-off edges 53 are given reference signs in FIG. 2a.

In addition to the aforementioned depressions 26, the pressure plate 24 comprises passage openings 52 on the top side 48, through which the remaining buttons 30 to 40 are led to project through the pressure plate 48. Grooves 54 are executed on the passage openings 52 on the bottom side 50 of the pressure plate 24, in which spigots 89 on the buttons 28 to 40, which are shown in FIG. 5a, can engage for anti-twist protection.

The pressure plate 24 also comprises fastening elements 56 on the bottom side 50 and a snap hook 58 to prevent the pressure plate 24 in the remote control 24 from falling out.

Figure 3B:
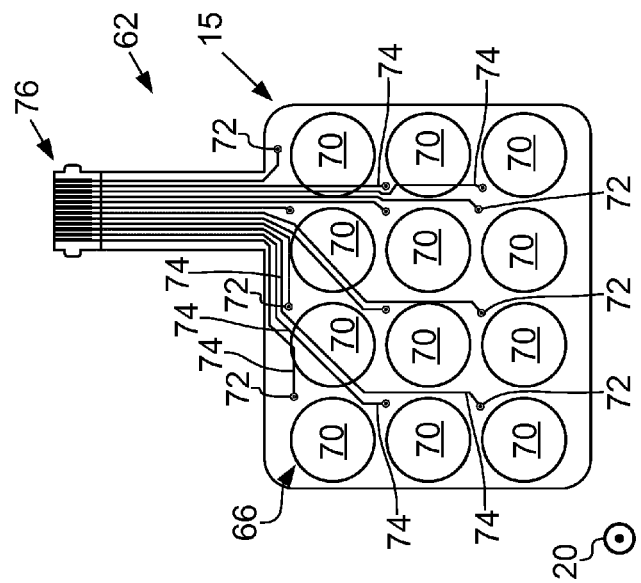
Figure 3A:
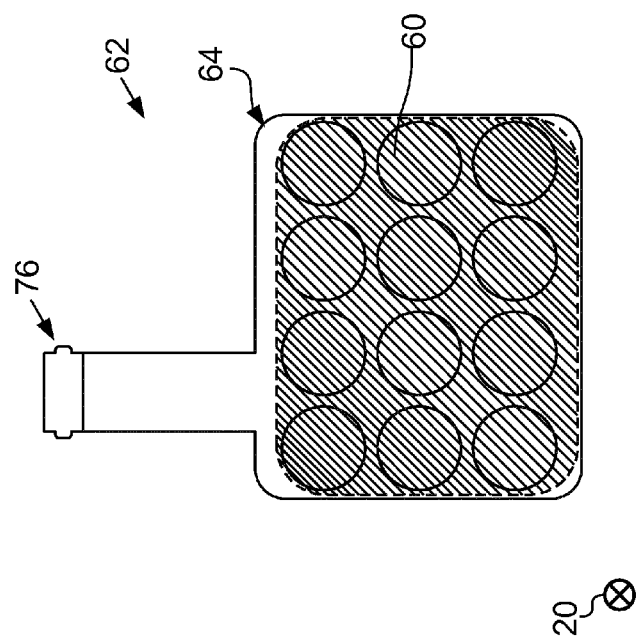
FIG. 3a is a top side of a capacitive sensor in the remote control of FIG. 1.

Finally, a hatched adhesive surface 60 is provided on the bottom side 50 of the pressure plate 24, to which a capacitive sensor in the form of a capacitive switch membrane 62 can be affixed, which is shown in FIG. 3a from its top side 64 and in FIG. 3b from its bottom side 66 as an example.

The switch membrane 62 comprises an adhesive film 68 on its top side 64, which can be used to attach the switch membrane 62 to the bottom side 50 of the pressure plate 24 on the adhesive surface 50.

For reasons of clarity, the elements described in the following do not have reference signs in FIG. 3a, but only in FIG. 3b. Twelve capacitor plates 70 are embedded in the switch membrane 62 between the top side 64 and the bottom side 66, which are arranged to form the same grid 15 as the grid 15 of the depressions 26 on the top side 48 of the pressure plate 48. At a distance to each capacitor plate 70, an evaluation electrode 72 is assigned to each capacitor plate 70, which do not all have reference signs for reasons of clarity. From every evaluation electrode 72 an evaluation line 74 on the switch membrane 62 leads to an interface 76 which can then be connected to an electronic evaluation system in the form of a printed circuit board which is shown in FIGS. 7a and 7b. For the sake of clarity, not all of the evaluation lines 74 are given their own reference signs.

Figure 4:
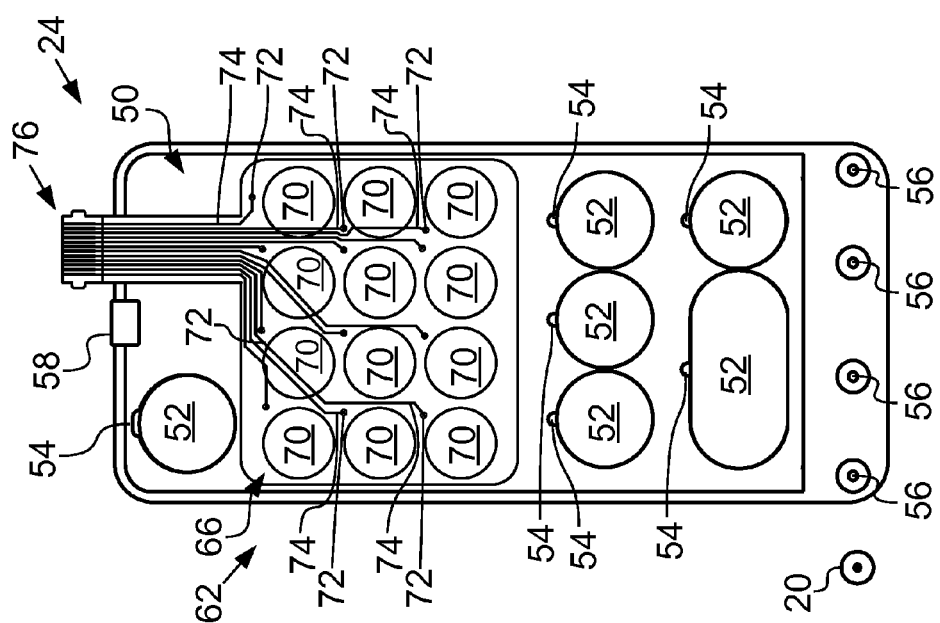
FIG. 4 is a view of the pressure plate and the capacitive sensor of the bottom side connected to it.
Figure 8:
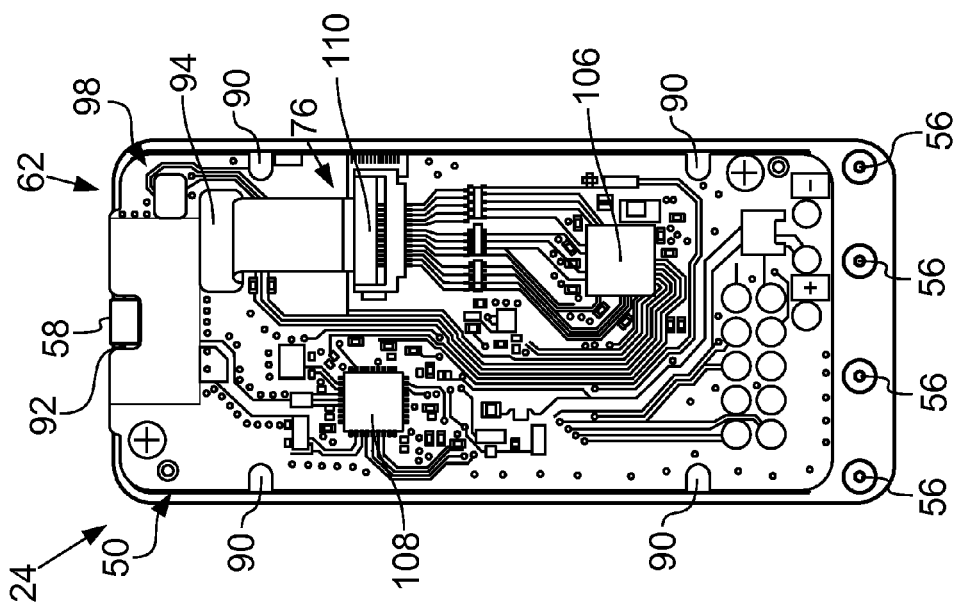

FIG. 4 shows the switch membrane 62 affixed to the bottom side 50 of the pressure plate 24.

In the present embodiment, the switch membrane 62 shows a first option for inputting information. The user places their finger in one of the depressions 26 on the top side 48 of the pressure plate 24, and thus changes the capacitance between the capacitor plate 70 which is positioned directly beneath the corresponding depression 26 and the directly adjoining evaluation electrode 72. The printed circuit board 78 can detect and evaluate this altered capacitance via the evaluation line 74, and use these values to generate the position signal 42 for generating the highlighting 44 on the screen 8 which is shown in FIG. 1.

In order to select or activate the menu element 16 highlighted by the highlighting 44, the user presses the pressure plate 24 in the direction of pressure application 20. In order to record this pressure, the remote control 6 is equipped with a switching plate 80 which shall be described in more detail by means of FIG. 5a which shows the switching plate 80 from a top side 82 and FIG. 5b which shows the switching plate 80 which shows the bottom side 84.

A pressure take-up element 84 for the pressure plate 24 and further pressure take-up elements 86 for the remaining buttons 30 to 40 are executed on the top side 82 of the switching plate 80. In FIG. 5a, the buttons 28, 30, 32 are already assigned to some of the further pressure take-up elements 86, which is why these further pressure take-up elements 86 are not visible in the perspective of FIG. 5a. The previously mentioned spigots 89 for providing the anti-twist protection are visible on the buttons 30, 32.

Contact domes 88 are arranged on the bottom side 84 of the switching plate 80 opposite the pressure take-up elements 84, 86, which can be pressed down by the pressure take-up elements 84, 86 to establish an electrical contact on the printed circuit board 78 in a manner still to be described.

For secure mounting of the complete switching plate in the remote control, various interlocking elements such as grooves and through holes are arranged on it. Finally, a feed-through opening 94 is executed on the switching plate 80, through which the interface 76 of the switch membrane can be led.

FIG. 6 shows the switching plate 80 installed on the bottom side 50 of the pressure plate 24, wherein the switch membrane 62 is affixed to the pressure plate 24 as shown in FIG. 4.

The switching plate 80 is made of a flexible material. If the operator applies pressure on one of the pressure take-up elements 84, 86 on the top side 82 of the switching plate 80 in the pressure application direction 20, the pressure is transmitted to the contact domes 88. These are flattened by the pressure and contact a circuit on the printed circuit board 78 in the manner described in the following.

For this purpose, reference is made to FIGS. 7a and 7b, which show the printed circuit board from a top side 96 and a bottom side 98 respectively.

The printed circuit board 78 is equipped with various electronic components which do not need any further explanation for a deeper understanding of the invention. Constructions elements without reference signs will not be described in more detail.

Contact elements 100 with one outer ring 102 and one inner ring 104 each are arranged on the top side 96 of the printed circuit board 78 at the same position as the contact domes 88 on the bottom side 84 of the switching plate 80. If the user presses one of the buttons 30 to 40 in the previously mentioned manner, and thus presses down one of the contact domes 88 via the pressure take-up elements 84, 86, the pressed contact dome 88 short circuits the outer ring 102 which is located beneath it respectively in the pressure direction 20 with the inner ring 104. This causes the closure of a circuit on the printed circuit board 78. The circuits related to the individual contact elements 100 have no reference signs in FIGS. 7*a* and 7*b* for reasons of clarity.

The circuits are connected to an evaluation device 106 on the printed circuit board 78. The evaluation device 106 records when a circuit assigned to one of the contact elements 100 is closed, and outputs a corresponding signal to a signal generation device 108. On this basis, the signal generation device 108 then transmits the trigger signal 46 to the multimedia system 4.

In addition, the printed circuit board is equipped with a connector 110 to which the interface 76 of the switch membrane 62 can be connected. This connector 110 is used to transmit the signals on the evaluation lines 74 of the switch membrane 62 to the evaluation device 106, which on this basis then controls the signal generation device 108. In analogy to the transmission of the trigger signal 46, the signal generation device 108 then transmits the position signal 42 depending on this control.

Figure 9:
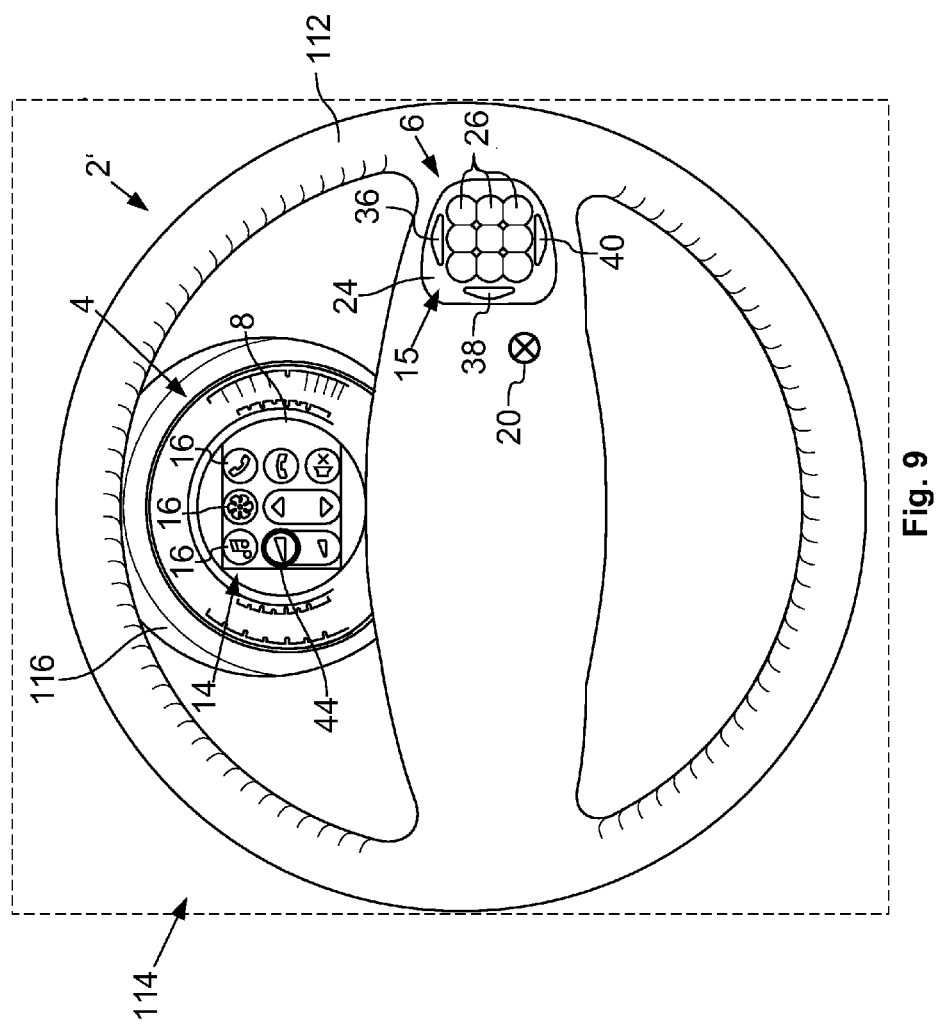
FIG. 9 is a schematic representation of an alternative multimedia system with a playback device and a remote control.

Reference is made to FIG. 9 which shows a schematic representation of an alternative multimedia system 2 with the playback device 4 and the remote control 6.

The remote control 6 of the alternative multimedia system 2' is part of a steering wheel 112 in the cockpit 114 of vehicle not shown here. Through the steering wheel 112, a dashboard display 116 can be seen in the background which also contains the playback device 4 of the alternative multimedia system 2'.

The grid 15 on the pressure plate 24 of the remote control 6 of the alternative multimedia system 2' has only nine depressions 26 which are arranged in three rows and three columns. The user can hold the steering wheel 112 with their hand and place their thumb/finger in one of the depressions on the pressure plate 24. In the previously described manner, the remote control 6 in the alternative multimedia system 2 detects in which depression 26 the thumb/finger is placed, and transmits the position signal 42. The signal may also be transmitted, however, via a cable in the vehicle. According to the position signal 42, the menu element 16 which is assigned to the depression 26 on which the thumb/finger is lying is displayed in the cockpit 116 by means of the highlighting 44.

If the user presses down the pressure plate 24 in the pressure application direction 20 with their thumb/finger, the menu element 16 displayed with the highlighting 44 is activated.

Due to the fact that the user can retrace their control of the menu 14 by means of the highlighting 44 before every activation, they do not need any direct visual contact with the pressure plate 24 which is used to control the menu 14. In this way, they can control the menu while driving without having to see their fingers. It does not matter whether the menu 14 is the tile menu of a smartphone or any other menu.

The invention claimed is:

1. An input device (6) for operating a multimedia device (4) depending on the position of a user's finger on a pressure plate (24) comprising:

the pressure plate (24) which comprises a bottom side (50) and a top side (48) opposite the bottom side (50), on which the user can move their finger, a regular grid (15) made of 12 tactile elements (26) which can be haptically sensed by the user's finger and which are formed on the top side (48) of the pressure plate (24), wherein the regular grid (15) is arranged to form a same grid as a grid (15) of a menu (14) on a screen (8) and each of the tactile elements (26) on the remote control (6) is assigned to a menu item (16) of the menu (14);

a capacitive switch membrane (62) embedding with sensor plates (70) arranged on the bottom side (50) of the pressure plate (24) which is set up to transmit a button selection signal (42) to the multimedia device (4) depending on the position of the finger on the top side (48), wherein the sensor plates are arranged to form the same grid as the regular grid (15) of the tactile elements (26) on the top side (48) of the pressure plate (24); an evaluation electrode (72) corresponding to each of the sensor plates (70) is assigned to the each capacitor plate (70); from every evaluation electrode (72), an evaluation line (74) corresponding to the evaluation electrode (72) on the switch membrane (62) leads to an interface (76) which can then be connected to an electronic evaluation system (106) in the form of a printed circuit board (78); a feed-through opening (94) on an upper left corner of the switching plate (80) is executed on the switching plate (80), through which the interface (76) of the switch membrane (62) can be led; the printed circuit board (78) is equipped with a connector (110) to which the interface (76) of the switch membrane (62) can be connected; the connector (110) is used to transmit signals on the evaluation line (74) of the switch membrane (62) to the evaluation device (106), which controls a signal generation device (108); and a switching plate (80) installed on the bottom side (50) of the pressure plate (24), wherein;

a first pressure take-up element (84) for the pressure plate (24) and second pressure take-up elements (86) for remaining buttons (30, 32, 36, 38, 40) are disposed on a top side of the switching plate (80);

contact domes (88) are arranged on a bottom side of the switching plate (80) opposite the pressure take-up elements (84, 86), which are configured to be pressed down by the first and second pressure take-up elements (84, 86) to establish an electrical contact on a printed circuit board (78);

seven contact elements (100) each comprising an outer ring (102) and an inner ring (104) each are arranged on a top side of the printed circuit board (78) at the same position as the contact domes (88) on the bottom side of the switching plate (80); and when pressed by the user via pressure take-up elements (84), the contact domes (88) short circuit the outer ring (102) with the inner ring (104) causing closure of a circuit on the printed circuit board (78).

2. The input device (6) according to claim 1, wherein the grid (15) is executed as a Cartesian grid.

3. The input device (6) according to claim 2, wherein the structured grid is a Cartesian grid.

4. The input device (6) according to claim 1, wherein the pressure plate (24) is mounted so that it can move in a direction (20) vertical to the top side (48) and bottom side (50), and wherein a pressure button (84, 88, 100) is arranged on the bottom side (50) of the pressure plate (24) to generate a button activation signal (46) with its pressure.

5. The input device (6) according to claim 1, further comprising: a transmission interface for sending a position signal depending on a position of a user's finger on one of the tactile elements (26), as well as a trigger signal when the one of the tactile elements (26) is pressed by the user to activate function assigned to a highlighted menu item (44) of the menu (14).

6. The input device (6) according to claim 1, wherein the tactile elements (26) are embedded in the top side (48) of the pressure plate (24) in a shape of ball segments, each tactile element as a ball segment and the base circle of the each tactile element are in flush with the surface of the top side (48) of the pressure plate (24).

7. The input device (6) of claim 1, wherein the menu item (16) of the menu (14), the regular grid (15), twelve capacitor plates (70) embedded in the switch membrane (62) between the top side (48) and the bottom side (66) all are evenly arranged in three rows and four columns; and seven contact elements (100) are arranged in three rows and three columns with one contact element in the first row in a middle and three contact elements each are evenly disposed in the second row and the third row.

8. The input device (6) of claim 1, wherein the tactile elements (26) which can be detected in a haptic manner are concave depressions embedded in the top side (48) of the pressure plate (24), wherein the concave depressions are substantially executed in a shape of ball segments, the concave depressions adjoin each other to form cut-off edges (53), the concave depressions are positioned in such a way that the ball segments overlap, and cut-off edges (53) are executed between the concave depressions.

9. The input device (6) according to claim 8, wherein the concave depressions have a maximum width extension (51) between 5 mm and 15 mm in the direction of the surface (48) of the pressure plate (24).

10. The input device (6) according to claim 9, wherein the concave depressions have a depth between 5% and 15% of the maximum width extension (51).

11. The input device (6) according to claim 10, wherein the input device (6) further comprises a metal housing (18) with an opening (19) below the pressure plate (24) to reduce the weight; the opening (19) is a slot and the regular grid (15) is arranged in at least three rows and at least four columns of tactile elements (26).

12. The input device (6) according to claim 11, wherein the input device (6) further comprises grooves (54) executed on passage openings (52) on the bottom side (50) of the pressure plate (24), in which spigots (89) can engage for antitwist protection.

13. The input device (6) according to claim 12, wherein the pressure plate (24) further comprises fastening elements (56) on the bottom side (50) and a snap hook (58) to prevent the pressure plate (24) from falling out of the input device (6).

14. A method for recording a control information (42, 46) with an input device (6), for operating a multimedia device (4) depending on the position of a user's finger on a pressure plate (24) comprising the pressure plate (24) which comprises a bottom side (50) and a top side (48) opposite the bottom side (50), on which the user can move their finger, a regular grid (15) made of tactile elements (26) which can be haptically sensed by the user's finger and which are formed on the top side (48) of the pressure plate (24), wherein the regular grid (15) are arranged to form a same grid as a grid (15) of a menu (14) on a screen (8) and each of the tactile elements (26) on the remote control (6) is assigned a menu item (16) of the menu (14), a capacitive switch membrane (62) embedding with sensor plates (70) arranged on the bottom side (50) of the pressure plate (24) which is set up to transmit a button selection signal (42) to the multimedia device (4) depending on the position of the finger on the top side (48), wherein the sensor plates are arranged to form the same grid as the regular grid (15) of the tactile elements (26) on the top side (48) of the pressure plate (24), and a switching plate (80) installed on the bottom side (50) of the pressure plate (24), wherein an evaluation electrode (72) corresponding to each of the sensor plates (70) is assigned to the each capacitor plate (70); from every evaluation electrode (72), an evaluation line (74) corresponding to the evaluation electrode (72) on the switch membrane (62) leads to an interface (76) which can then be connected to an electronic evaluation system (106) in the form of a printed circuit board (78); a feed-through opening (94) on an upper left corner of the switching plate (80) is executed on the switching plate (80), through which the interface (76) of the switch membrane (62) can be led; the printed circuit board (78) is equipped with a connector (110) to which the interface (76) of the switch membrane (62) can be connected; the connector (110) is used to transmit signals on the evaluation line (74) of the switch membrane (62) to the evaluation device (106), which controls a signal generation device (108);

a first pressure take-up element (84) for the pressure plate (24) and second pressure take-up elements (86) for remaining buttons (30, 32, 36, 38, 40) are disposed on a top side of the switching plate (80); and contact domes (88) are arranged on a bottom side of the switching plate (80) opposite the pressure take-up elements (84, 86), which are configured to be pressed down by the first and second pressure take-up elements (84, 86) to establish an electrical contact on a printed circuit board (78), and the method comprising:

detecting the position of the user's finger on the pressure plate (24), transmitting the button selection signal (42) depending on the recorded position and transmitting the button confirmation signal (46) if a specified requirement is fulfilled wherein the button selection signal (42) in combination with the button confirmation signal (46) is the control information (42, 46);

seven contact elements (100) each comprising an outer ring (102) and an inner ring (104) each are arranged on a top side of the printed circuit board (78) at the same position as the contact domes (88) on the bottom side of the switching plate (80); and when pressed by the user via pressure take-up elements (84), the contact domes (88) short circuit the outer ring (102) with the inner ring (104) causing closure of a circuit on the printed circuit board (78).

15. The method for recording a control information (42, 46) with an input device (6) according to claim 14, wherein the input device further comprises: a transmission interface for sending a position signal depending on a position of a user's finger on one of the tactile elements (26), as well as a trigger signal when the one of the tactile elements (26) is pressed by the user to activate function assigned to a highlighted menu item (44) of the menu (14).

16. The method for recording a control information (42, 46) with an input device (6) according to claim 14, wherein the tactile elements (26) are embedded in the top side (48) of the pressure plate (24), each tactile element as a ball segment and the base circle of the each tactile element are in flush with the surface of the top side (48) of the pressure plate (24).

17. The method for recording a control information (42, 46) with an input device (6) according to claim 14, wherein the tactile elements (26) which can be detected in a haptic manner are concave depressions embedded in the top side (48) of the pressure plate (24), wherein the concave depressions are substantially executed in a shape of ball segments, the concave depressions adjoin each other to form cut-off edges (53), the concave depressions are positioned in such a way that the ball segments overlap, and cut-off edges (53) are executed between the concave depressions.

18. A control device (106, 108) with a processing system, the control device (106, 108) operable to operate a multimedia device (4) depending on the position of a user's finger on a pressure plate (24) comprising the pressure plate (24) which comprises a bottom side (50) and a top side (48) opposite the bottom side (50), on which the user can move their finger, a regular grid (15) made of tactile elements (26) which can be haptically sensed by the user's finger and which are formed on the top side (48) of the pressure plate (24), wherein the regular grid (15) are arranged to form a same grid as a grid (15) of a menu (14) on a screen (8) and each of the tactile elements (26) on the remote control (6) is assigned a menu item (16) of the menu (14), a capacitive switch membrane (62) embedding with sensor plates (70) arranged on the bottom side (50) of the pressure plate (24) which is set up to transmit a button selection signal (42) to the multimedia device (4) depending on the position of the finger on the top side (48), wherein the sensor plates are arranged to form the same grid as the regular grid (15) of the tactile elements (26) on the top side (48) of the pressure plate (24), and a switching plate (80) installed on the bottom side (50) of the pressure plate (24), wherein an evaluation electrode (72) corresponding to each of the sensor plates (70) is assigned to the each capacitor plate (70); from every evaluation electrode (72), an evaluation line (74) corresponding to the evaluation electrode (72) on the switch membrane (62) leads to an interface (76) which can then be connected to an electronic evaluation system (106) in the form of a printed circuit board (78); a feed-through opening (94) on an upper left corner of the switching plate (80) is executed on the switching plate (80), through which the interface (76) of the switch membrane (62) can be led; the printed circuit board (78) is equipped with a connector (110) to which the interface (76) of the switch membrane (62) can be connected; the connector (110) is used to transmit signals on the evaluation line (74) of the switch membrane (62) to the evaluation device (106), which controls a signal generation device (108);

a first pressure take-up element (84) for the pressure plate (24) and second pressure take-up elements (86) for remaining buttons (30, 32, 36, 38, 40) are disposed on a top side of the switching plate (80); and contact domes (88) are arranged on a bottom side of the switching plate (80) opposite the pressure take-up elements (84, 86), which are configured to be pressed down by the first and second pressure take-up elements (84, 86) to establish an electrical contact on a printed circuit board (78), the control device being configured to:

detect a position of the user's finger on a pressure plate (24), transmit a button selection signal (42) depending on a recorded position, transmit a button confirmation signal (46) if a specified requirement is fulfilled wherein the button selection signal (42) in combination with the button confirmation signal (46) is a control information (42, 46), seven contact elements (100) each comprising an outer ring (102) and an inner ring (104) each are arranged on a top side of the printed circuit board (78) at the same position as the contact domes (88) on the bottom side of the switching plate (80), and when pressed by the user via pressure take-up elements (84), the contact domes (88) short circuit the outer ring (102) with the inner ring (104) causing closure of a circuit on the printed circuit board (78).

19. The control device (106, 108) with a processing system according to claim 18, wherein the input device further comprises: a transmission interface for sending a position signal depending on a position of a user's finger on one of the tactile elements (26), as well as a trigger signal when the one of the tactile elements (26) is pressed by the user to activate function assigned to a highlighted menu item (44) of the menu (14).

20. The control device (106, 108) with a processing system according to claim 18, wherein the tactile elements (264 are embedded in the top side (484 of the pressure plate (24), each tactile element as a ball segment and the base circle of the each tactile element are in flush with the surface of the top side (48) of the pressure plate (24).

* * * * *